US 12,327,740 B2

(12) United States Patent
Wang

(10) Patent No.: US 12,327,740 B2
(45) Date of Patent: Jun. 10, 2025

(54) METHOD FOR ADJUSTING CHIP MOUNTING POSITION, APPARATUS, MEDIUM, AND ELECTRONIC DEVICE

(71) Applicant: CHANGXIN MEMORY TECHNOLOGIES, INC., Hefei (CN)

(72) Inventor: Hailin Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 645 days.

(21) Appl. No.: 17/668,654

(22) Filed: Feb. 10, 2022

(65) Prior Publication Data
US 2022/0367219 A1 Nov. 17, 2022

Related U.S. Application Data

(63) Continuation of application No. PCT/CN2021/121333, filed on Sep. 28, 2021.

(30) Foreign Application Priority Data

May 13, 2021 (CN) .......................... 202110522110.4

(51) Int. Cl.
H01L 21/67 (2006.01)
(52) U.S. Cl.
CPC .. *H01L 21/67259* (2013.01); *H01L 21/67144* (2013.01)
(58) Field of Classification Search
CPC ................................................ H01L 21/67259
See application file for complete search history.

(56) References Cited

U.S. PATENT DOCUMENTS

| 5,690,785 A | * | 11/1997 | Nakaya | G03F 7/20 |
| | | | | 438/585 |
| 6,018,395 A | * | 1/2000 | Mori | G03F 9/70 |
| | | | | 250/548 |
| 6,239,858 B1 | * | 5/2001 | Tomimatu | G03F 7/70633 |
| | | | | 430/311 |
| 8,594,825 B2 | * | 11/2013 | Wahlsten | G03F 7/70383 |
| | | | | 700/121 |
| 10,742,324 B1 | | 8/2020 | Padmaraju et al. | |
| 2005/0056947 A1 | * | 3/2005 | Blessing | H01L 24/32 |
| | | | | 257/E21.505 |

(Continued)

FOREIGN PATENT DOCUMENTS

CN 1844845 A 10/2006
CN 104392950 A 3/2015
(Continued)

*Primary Examiner* — William A Harriston
(74) *Attorney, Agent, or Firm* — Kilpatrick Townsend & Stockton LLP

(57) ABSTRACT

A method for adjusting a chip mounting position, an apparatus, a medium, and an electronic device are provided. The adjustment method includes: obtaining offsets of actual mounting positions of individual chips in a first group of chips; obtaining an average offset for the actual mounting positions of the individual chips in the first group of chips according to the offsets of the actual mounting positions of the individual chips in the first group of chips; and adjusting the chip mounting position according to the average offset for the actual mounting positions of the individual chips in the first group of chips.

10 Claims, 9 Drawing Sheets

(56) References Cited

U.S. PATENT DOCUMENTS

| | | | | |
|---|---|---|---|---|
| 2012/0066898 A1* | 3/2012 | Gustafsson | ....... | H01L 21/67132 |
| | | | | 29/700 |
| 2016/0079199 A1* | 3/2016 | Seok | ........................ | B23K 3/04 |
| | | | | 228/9 |
| 2022/0223450 A1* | 7/2022 | Seyama | ............ | H01L 21/67259 |

FOREIGN PATENT DOCUMENTS

| | | |
|---|---|---|
| CN | 108962791 A | 12/2018 |
| CN | 209183509 U | 7/2019 |
| CN | 112331592 A | 2/2021 |

\* cited by examiner

METHOD FOR ADJUSTING CHIP MOUNTING POSITION, APPARATUS, MEDIUM, AND ELECTRONIC DEVICE

CROSS-REFERENCE TO RELATED APPLICATION

This is a continuation application of International Patent Application No. PCT/CN2021/121333, filed on Sep. 28, 2021, which claims priority to Chinese Patent Application No. 202110522110.4, entitled "METHOD FOR ADJUSTING CHIP MOUNTING POSITION, APPARATUS, MEDIUM, AND ELECTRONIC DEVICE" and filed on May 13, 2021. The disclosures of International Patent Application No. PCT/CN2021/121333 and Chinese Patent Application No. 202110522110.4 are incorporated by reference herein in their entireties.

BACKGROUND

With a trend of structure miniaturization and thinning of a chip product, and with increasingly common application of a chip misalignment iteration structure, a chip misalignment size is closer to a device capability limit. In addition, a position deviation center value of a patch continues to shift during continuous operation of a patching machine.

It should be noted that the information disclosed in the foregoing background is merely used to enhance understanding of the background of the disclosure, and therefore may include information that does not constitute the prior art known to a person of ordinary skill in the art.

SUMMARY

The disclosure relates to the technical field of semiconductor, and specifically, to a method for adjusting a chip mounting position, an apparatus, a computer-readable storage medium, and an electronic device.

Embodiments of the disclosure aim to provide a method for adjusting a chip mounting position, an apparatus, a computer-readable storage medium, and an electronic device.

Other features and advantages of the disclosure will be apparent from the following detailed descriptions, or may be partially learned by the practice of the disclosure.

According to a first aspect of the embodiments of the disclosure, there is provided a method for adjusting a chip mounting positions. The method includes the following operations.

Offsets of actual mounting positions of individual chips in a first group of chips are obtained.

An average offset for the actual mounting positions of the individual chips in the first group of chips is obtained according to the offsets of the actual mounting positions of the individual chips in the first group of chips.

The chip mounting position is adjusted according to the average offset for the actual mounting positions of the individual chips in the first group of chips.

According to a second aspect of the embodiments of the disclosure, there is provided a chip mounting apparatus, including: a first obtaining device, a second obtaining device and an adjustment device.

The first obtaining device is configured to obtain offsets of actual mounting positions of individual chips in a first group of chips.

The second obtaining device is configured to obtain an average offset for the actual mounting positions of the individual chips in the first group of chips according to the offsets of the actual mounting positions of the individual chips in the first group of chips.

The adjustment device is configured to adjust chip mounting position according to the average offset for the actual mounting positions of the individual chips in the first group of chips.

According to a third aspect of the embodiments of the disclosure, there is provided an electronic device, including: one or more processors; and a storage apparatus.

The storage apparatus is configured to store one or more programs. When the one or more programs are executed by the one or more processors, the one or more processors implement the method in any one of the foregoing embodiments.

According to a fourth aspect of the embodiments of the disclosure, there is provided a computer-readable storage medium. The computer-readable storage medium stores a computer program, and when the computer program is executed by a processor, the method in any one of the foregoing embodiments is implemented.

It should be understood that the foregoing general descriptions and the following detailed descriptions are merely examples and explanations, and cannot limit the disclosure.

BRIEF DESCRIPTION OF THE DRAWINGS

The accompanying drawings herein incorporated in the specification and becoming a part of the specification show embodiments in accordance with the disclosure, which are used with the specification to explain a principle of the disclosure. Apparently, the accompanying drawings in the following description merely show some embodiments of the disclosure, and a person of ordinary skill in the art can obtain other figures from these accompanying drawings without creative efforts. In the accompanying drawings.

DETAILED DESCRIPTION

Figure 1:
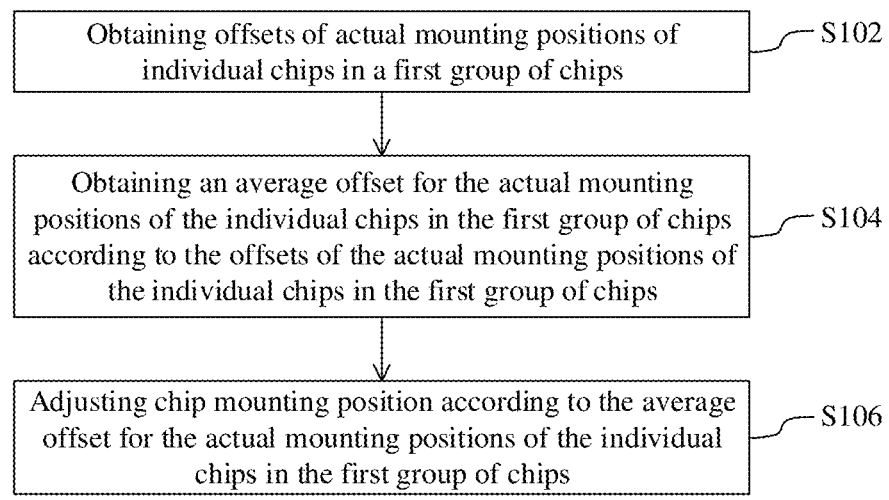
FIG. 1 schematically shows a method for adjusting a chip mounting position according to an exemplary implementation of the disclosure.

At present, the exemplary implementations are comprehensively described with reference to the accompanying drawings. However, the exemplary implementations can be implemented in a plurality of forms, and it should not be understood that the exemplary implementations are limited to the examples described herein. On the contrary, by providing these embodiments, the disclosure is more comprehensive and complete, and a concept of the exemplary implementations is comprehensively conveyed to a person skilled in the art. Same reference numerals in the figures represent same or similar structures, and therefore their detailed descriptions are omitted.

Although the relative terms such as "above" and "below" are used in the specification to describe a relative relationship between one assembly and another assembly marked in the figures, these terms are used in the specification for convenience only, for example, according to a direction of the example described in the accompanying drawings. It can be understood that, if a module marked in the figures is reversed, the described "above" assembly becomes a "below" assembly. Other relative terms such as "high", "low", "top", "bottom", "left", and "right" have similar meanings. When a structure is "above" other structures, it may mean that the structure is integrally formed on the other structures, or that the structure is "directly" disposed on the other structures, or that the structure is "indirectly" disposed on the other structures by using another structure.

The terms "a", "one", "the" are used to indicate that there is one or more elements/constituent parts/or the like. The terms "include" and "have" are used to denote an open inclusion and indicate that there may be other elements/constituent parts/or the like in addition to the listed elements/constituent parts/or the like.

A present chip mounting (Die bond) device has a capability of detecting a deviation between a position of each patch and an initial specified position during patching (chip mounting). The present chip mounting device can only monitor a position deviation in real time, but cannot automatically correct patching position precision. When a 3σ capability of the chip mounting device is apparently higher than a specified deviation, the chip mounting device can better ensure stability of the engineering quality. However, when the 3σ capability of the chip mounting device is close to the specified deviation, it is easy to cause poor engineering quality and an engineering capability Cpk not up to the standard. As a product becomes more and more complex, the patching accuracy requirements of a chip mounting device such as a patching machine have also increased. A deviation center value of the chip mounting position continues to shift during continuous operation of the chip mounting device such as the patching machine.

Cpk is an index of the capability of process machining for meeting machining quality and is a minimum fluctuation in the most stable state that measures internal consistency of process machining. When the process is in a stable state, 99.73% of quality characteristic values of a product are distributed in a range [μ−3σ, μ+3σ], where μ is an overall average of the characteristic values of the product, and σ is an overall standard deviation of the characteristic values of the product. That is, almost all characteristic values of the product fall within a range of 6σ. Therefore, a process capability is usually represented by 6σ (also referred to as 3σ), and the smaller its value, the better.

To solve the foregoing problem, the disclosure provides a method for adjusting a chip mounting position, to adjust the chip mounting position, thereby improving accuracy of the chip mounting position, and improving a product yield.

FIG. 1 schematically shows a method for adjusting a chip mounting position according to an exemplary implementation of the disclosure. The method provided in this embodiment of the disclosure may be executed by any electronic device that has a computer processing capability, such as a terminal device and/or a server. Referring to FIG. 1, the method for adjusting the chip mounting position is applicable to chip mounting, and may include the following steps.

At step S102, offsets of actual mounting positions of individual chips in a first group of chips are obtained.

At step S104, an average offset for the actual mounting positions of the individual chips in the first group of chips is obtained according to the offsets of the actual mounting positions of the individual chips in the first group of chips.

At step S106, the chip mounting position is adjusted according to the average offset for the actual mounting positions of the individual chips in the first group of chips.

In the technical solution of this embodiment of the disclosure, the average offset for the actual mounting positions of the individual chips in the first group of chips is obtained according to the offsets of the actual mounting positions of the individual chips in the first group of chips, and the chip mounting position is adjusted according to the average offset for the actual mounting positions of the individual chips in the first group of chips, thereby improving mounting precision of the chip mounting position and further improving a product yield.

At step S102, the offsets of the actual mounting positions of the individual chips in the first group of chips are obtained.

At this step, the terminal device and/or the service obtain/obtains the offsets of the actual mounting positions of the individual chips in the first group of chips. In an embodiment, the operation that the offsets of actual mounting positions of individual chips in a first group of chips are obtained includes the following operations.

Initial calibration positions of the individual chips in the first group of chips are obtained.

The actual mounting positions of the individual chips in the first group of chips are obtained.

The offsets of the actual mounting positions of the individual chips in the first group of chips are obtained according to the initial calibration positions of the individual chips in the first group of chips and the actual mounting positions of the individual chips in the first group of chips.

In an embodiment, the number of the first group of chips is for example 20. However, the disclosure is not limited thereto, and the first group of chips have multiple chips, for example, more than one chip.

At step S104, the average offset for the actual mounting positions of the individual chips in the first group of chips is obtained according to the offsets of the actual mounting positions of the individual chips in the first group of chips.

At this step, the terminal device and/or the service obtain/obtains the average offset for the actual mounting positions of the individual chips in the first group of chips according to the offsets of the actual mounting positions of the individual chips in the first group of chips. In an embodiment, after the offsets of the actual mounting positions of the individual chips in the first group of chips may be obtained, the offsets of the actual mounting positions of the individual chips in the first group of chips are added and then divided by the number of chips in the first group of chips, to obtain the average offset for the individual chips in the first group of chips. However, the disclosure is not limited thereto, and the average offset for the individual chips in the first group of chips may be obtained in another manner.

At step S106, the chip mounting position is adjusted according to the average offset for the actual mounting positions of the individual chips in the first group of chips.

At this step, the terminal device and/or the service adjust/adjusts the chip mounting position according to the average offset for the actual mounting positions of the individual chips in the first group of chips. In an embodiment, the operation that the chip mounting position is adjusted according to the average offset for the actual mounting positions of the individual chips in the first group of chips includes the following operation.

A mounting component for mounting the chip is adjusted according to a first proportion of the average offset for the actual mounting positions of the individual chips in the first group of chips.

In an embodiment, the operation that a mounting component for mounting the chip is adjusted according to a first proportion of the average offset for the actual mounting positions of the individual chips in the first group of chips includes the following operation.

The mounting component for mounting the chip is adjusted, according to a half (50%) of the average offset for the actual mounting positions of the individual chips in the first group of chips. In this embodiment, the first proportion is 50%, but the disclosure is not limited thereto. In other embodiments, the first proportion may be other percentages such as 10%, 20%, 30%, or 40%.

In an embodiment, the operation that a mounting component for mounting the chip is adjusted according to a first proportion of the average offset for the actual mounting positions of the individual chips in the first group of chips includes the following operation.

A suction nozzle or a mechanical arm for mounting the chip is adjusted, according to the first proportion of the average offset for the actual mounting positions of the individual chips in the first group of chips. In this embodiment, the mounting component is, for example, a suction nozzle or a mechanical arm. However, the disclosure is not limited to thereto, and the mounting component may be a device other than the suction nozzle or the mechanical arm.

In an embodiment, the offsets of the actual mounting positions of the individual chips in the first group of chips include displacement offsets and angle offsets, and the operation that the chip mounting position is adjusted according to the average offset for the actual mounting positions of the individual chips in the first group of chips includes the following operation.

The chip mounting position is adjusted according to an average displacement offset and an average angle offset for the actual mounting positions of the individual chips in the first group of chips.

Figure 2:
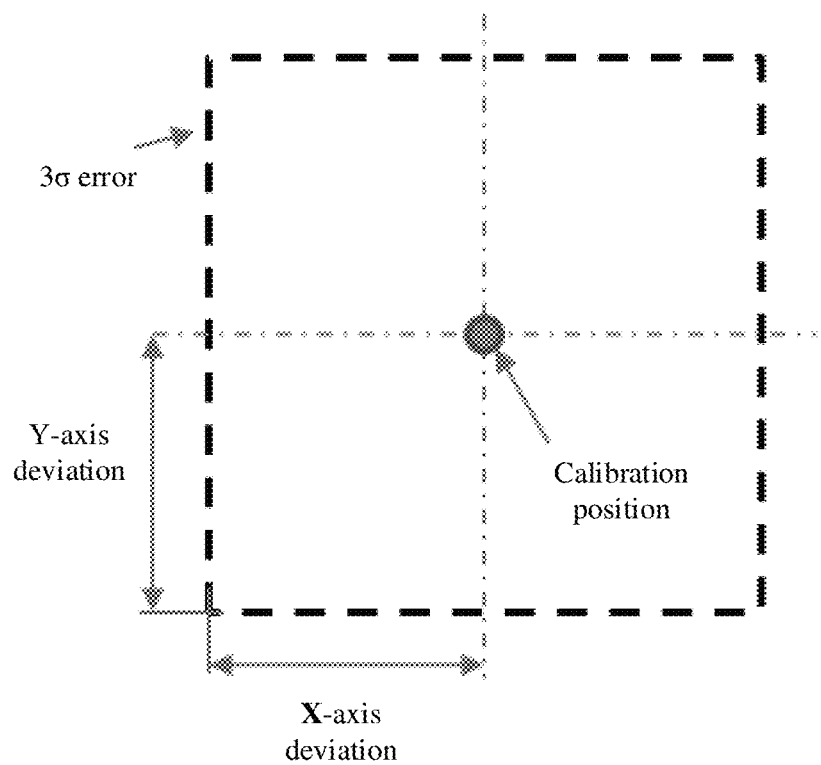
FIG. 2 is a schematic diagram of a chip calibration position according to an embodiment of the disclosure.

FIG. 2 is a schematic diagram of a chip calibration position according to an embodiment of the disclosure.

Figure 3:
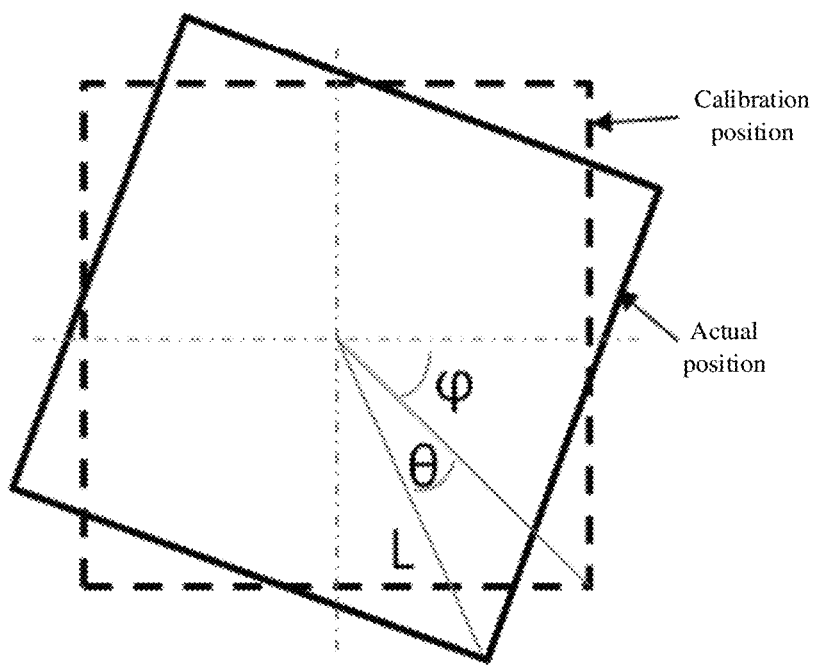
FIG. 3 is a schematic diagram of a chip calibration position and an actual position according to an embodiment of the disclosure.

FIG. 3 is a schematic diagram of a chip calibration position and a chip actual position according to an embodiment of the disclosure.

Referring to FIG. 2 and FIG. 3, a chip offset includes two aspects:
  horizontal (X) and vertical (Y) axial displacement offsets; and
  an angle offset, where the angle offset may cause additional horizontal and vertical axial displacement offsets;

$X$ total offset $= Xt + 2L \sin(\theta/2) \sin \varphi$;

$Y$ total offset $= Yt + 2L \sin(\theta/2) \cos \varphi$;

$Xt$ is a $3\sigma$ offset in the X direction;
$Yt$ is a $3\sigma$ offset in the Y direction;
$L$ is a distance from a chip center to a diagonal corner;
$\theta$-corner turning $3\sigma$ offset; and
$\varphi$ is an included angle between a diagonal line of a chip and the horizontal axis.

The offset in FIG. 2 and FIG. 3 is an offset of one vertex in vertices of four corners of a chip represented by a quadrilateral.

In an embodiment, the operation that the chip mounting position is adjusted according to an average displacement offset and an average angle offset for the actual mounting positions of the individual chips in the first group of chips includes the following operation.

A mounting component for mounting the chip is adjusted, according to a first proportion of each of the average displacement offset and the average angle offset for the actual mounting positions of the individual chips in the first group of chips.

In an embodiment, the operation that the mounting component for mounting the chip is adjusted according to a first proportion of each of the average displacement offset and the average angle offset for the actual mounting positions of the individual chips in the first group of chips includes the following operation.

A corresponding adjustment amount of a displacement adjustment motor for the mounting component and a corresponding adjustment amount of an angle adjustment motor for the mounting component are obtained respectively according to the average displacement offset and the average angle offset for the actual mounting positions of the individual chips in the first group of chips.

Further, the mounting component is adjusted according to the corresponding adjustment amount of the displacement adjustment motor for the mounting component and the corresponding adjustment amount of the angle adjustment motor for the mounting component.

Figure 4:
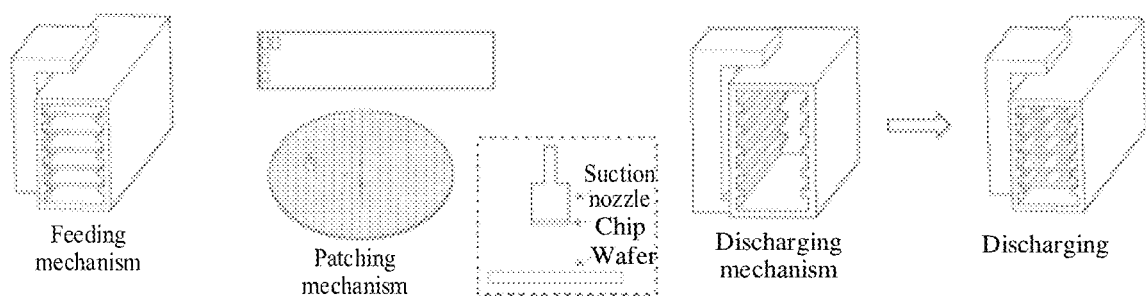
FIG. 4 is a schematic flowchart of chip mounting according to an embodiment of the disclosure.

FIG. 4 is a schematic flowchart of chip mounting according to an embodiment of the disclosure.

Referring to FIG. 4, a patching operation procedure includes the following steps.

1. A feeding mechanism of a patching machine grabs a new magazine, and a discharging mechanism grabs a new empty magazine.

2. After picking up chips on a wafer, a mounting component such as a suction nozzle attaches the chips to a substrate in sequence.

3. The substrate covered with the chips is transferred to the empty magazine in the discharging mechanism until the substrates in the magazines in the feeding mechanism are all attached and then discharging is performed.

Figure 5:
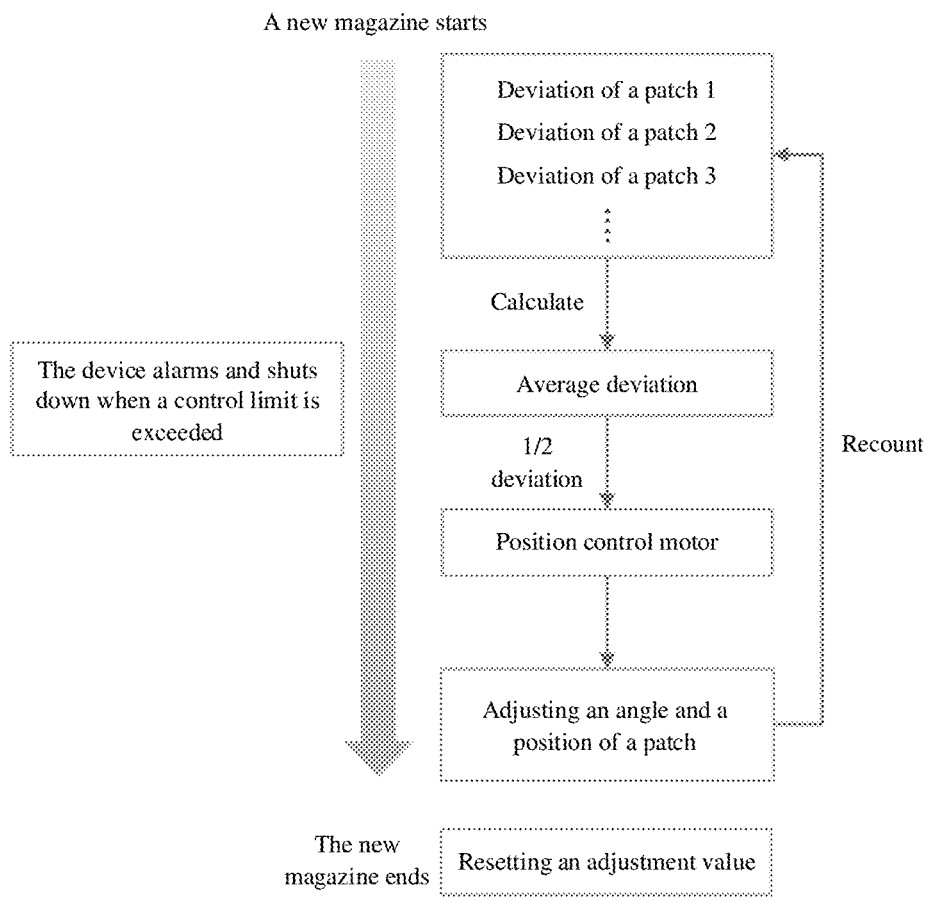
FIG. 5 is a schematic flowchart of a method for adjusting a chip mounting position according to an embodiment of the disclosure.

FIG. 5 is a schematic flowchart of a method for adjusting a chip mounting position according to an embodiment of the disclosure.

Referring to FIG. 5, a calibrated patching position is used as an initial position.

When a new magazine starts, an offset of each chip patch is measured.

An array deviation average is calculated by taking data of the first multiple chips (for example, the first 20 chips) as a basis.

½ of an average deviation is used as an adjustment value (a dichotomy is used for stabilization), and the adjustment value is fed back to a control apparatus for a mounting component such as a suction nozzle for patching, so that the control apparatus adjusts an angle and a horizontal displacement of the suction nozzle.

After the adjustment, deviations of the patches are recounted, and an average deviation level is recalculated.

When the magazine is discharged, the adjustment value is reset.

Figure 6:
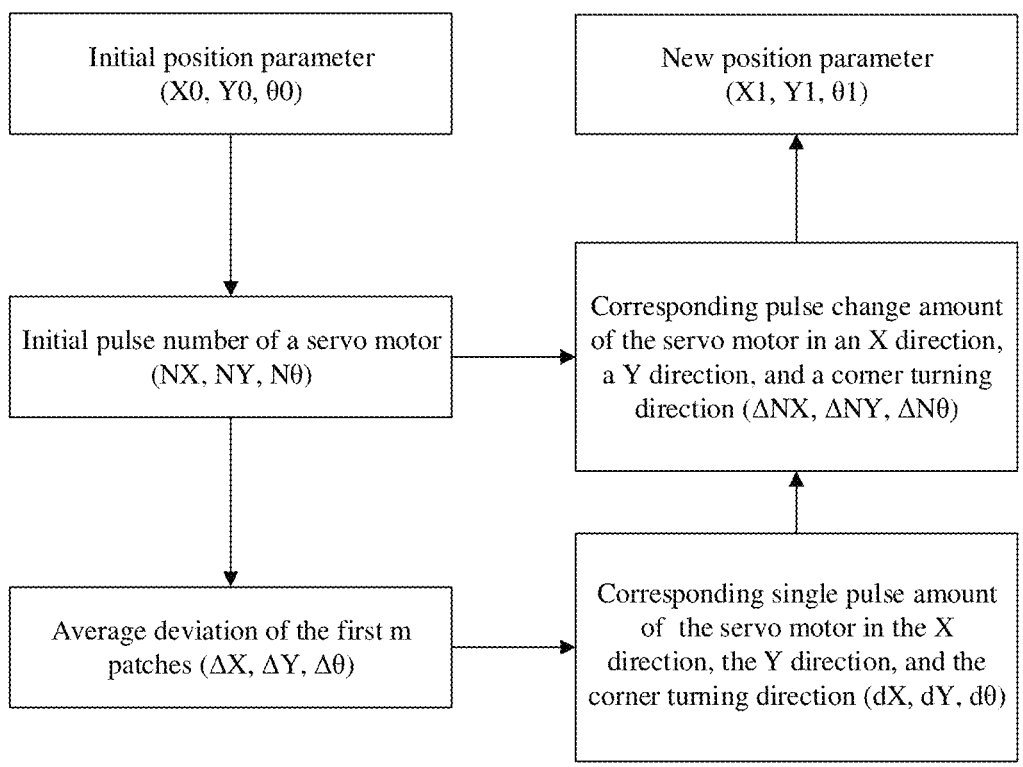
FIG. 6 is a schematic diagram of an adjustment principle of a servo motor for a mounting component in a method for adjusting a chip mounting position according to an embodiment of the disclosure.

FIG. 6 is a schematic diagram of an adjustment principle of a servo motor for a mounting component in a method for adjusting a chip mounting position according to an embodiment of the disclosure.

Referring to FIG. 5 and FIG. 6, in an embodiment, the operation that the mounting component is adjusted according to the corresponding adjustment amount of the displacement adjustment motor for the mounting component and the corresponding adjustment amount of the angle adjustment motor for the mounting component includes the following operations.

A pulse number of the displacement adjustment motor for the mounting component and a pulse number of the angle adjustment motor for the mounting component are respectively obtained according to the corresponding adjustment amount of the displacement adjustment motor for the mounting component and the corresponding adjustment amount of the angle adjustment motor for the mounting component.

Further, the mounting component is adjusted according to the pulse number of the displacement adjustment motor for the mounting component and the pulse number of the angle adjustment motor for the mounting component.

In an embodiment, the displacement offset includes a displacement offset in a first direction and a displacement offset in a second direction, and the operation that the chip mounting position is adjusted according to the average displacement offset and the average angle offset for the actual mounting positions of the individual chips in the first group of chips includes the following operation.

The chip mounting position is adjusted according to an average displacement offset in the first direction, an average displacement offset in the second direction, and the average angle offset for the actual mounting positions of the individual chips in the first group of chips. The first direction is, for example, an X-axis direction in FIG. 2, and the second direction is, for example, a Y-axis direction in FIG. 2.

Referring to FIG. 5, in an embodiment, an alarm is given when an offset of a chip in the first group of chips exceeds a control limit.

In an embodiment, the method for adjusting a chip mounting position in the disclosure further includes the following operations.

Offsets of actual mounting positions of individual chips in a second group of chips are obtained.

An average offset for the actual mounting positions of the individual chips in the second group of chips is obtained according to the offsets of the actual mounting positions of the individual chips in the second group of chips.

The chip mounting position is adjusted according to the average offset for the actual mounting positions of the individual chips in the second group of chips.

In addition, in the method for adjusting a chip mounting position in the disclosure, the chip mounting position is further adjusted according to the average offset for the actual mounting positions of the individual chips in the second group of chips, so that mounting accuracy of the chip mounting position can be continuously improved through the idea of continuous iteration, thereby improving a product yield.

Figure 7:
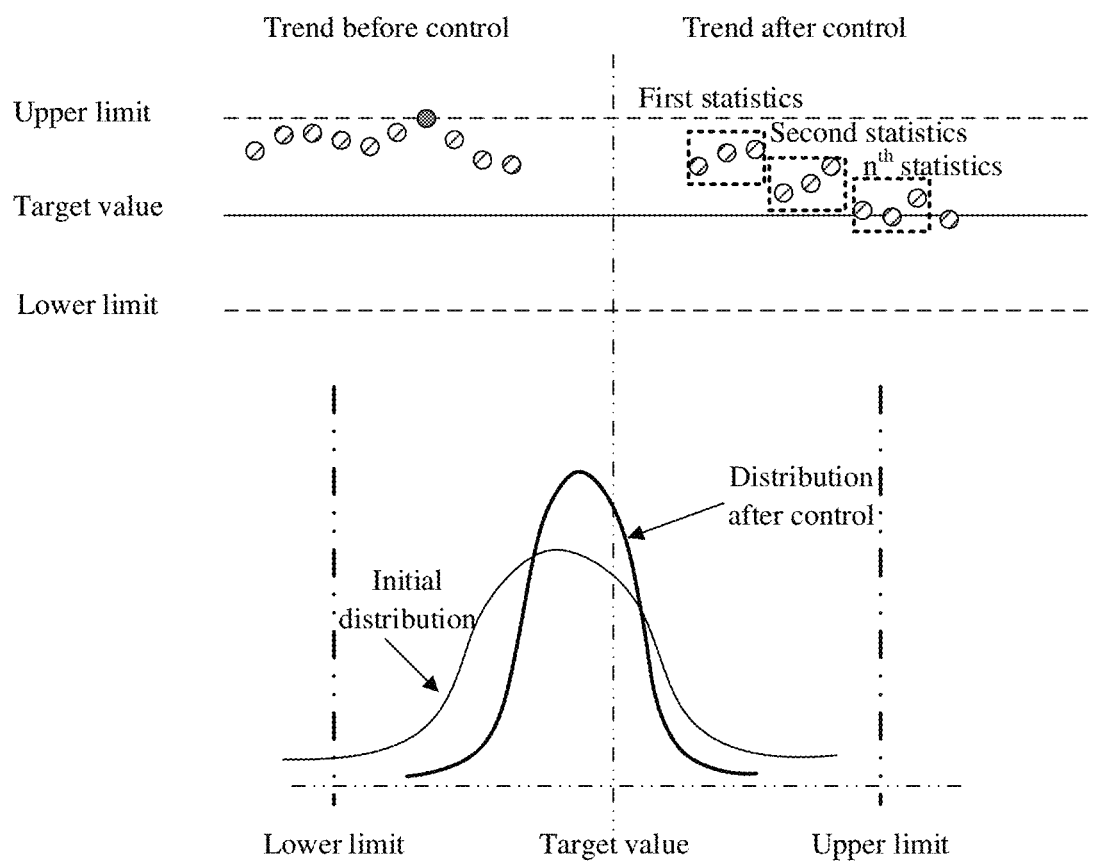
FIG. 7 is a schematic diagram of a statistical result of adjusting a chip mounting position by using an average offset for a plurality of groups of chips according to an embodiment of the disclosure.

FIG. 7 is a schematic diagram of a statistical result of adjusting the chip mounting position by using an average offset for a plurality of groups of chips according to an embodiment of the disclosure. According to the statistical result in FIG. 7, it can be clearly learned that the method in the disclosure can effectively improve chip mounting precision.

The following describes an embodiment of an apparatus in the disclosure, and the apparatus may be configured to execute the foregoing wafer position measurement method in the disclosure.

Figure 8:
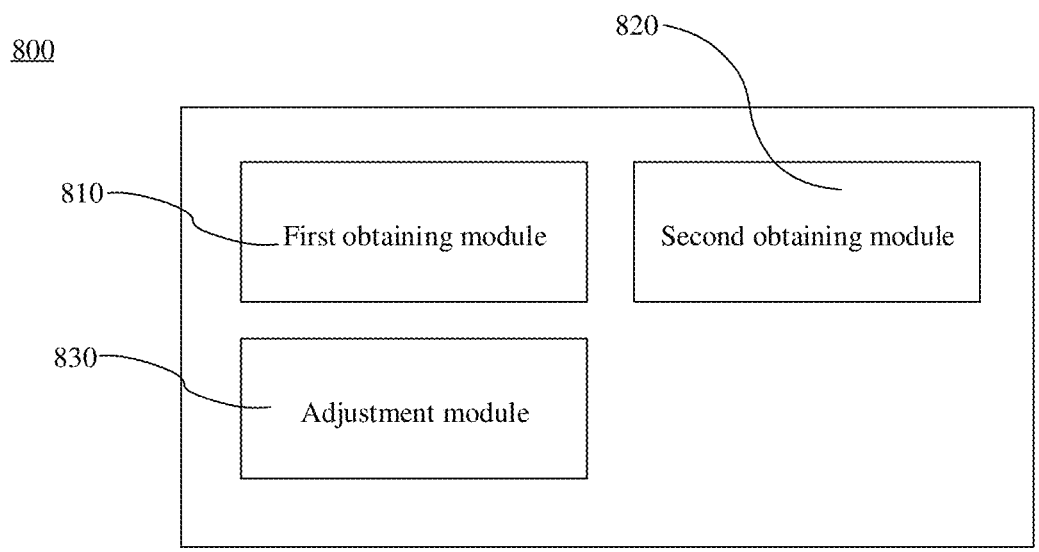
FIG. 8 shows an apparatus for adjusting a chip mounting position according to an embodiment of the disclosure.

FIG. 8 shows an apparatus 800 for adjusting a chip mounting position according to an embodiment of the disclosure.

As shown in FIG. 8, the apparatus 800 for adjusting a chip mounting position provided in this embodiment of the disclosure may include: a first obtaining module 810, a second obtaining module 820 and an adjustment module 830.

The first obtaining module is configured to obtain offsets of actual mounting positions of individual chips in a first group of chips.

The second obtaining module is configured to obtain an average offset for the actual mounting positions of the individual chips in the first group of chips according to the offsets of the actual mounting positions of the individual chips in the first group of chips.

The adjustment module is configured to adjust the chip mounting position according to the average offset for the actual mounting positions of the individual chips in the first group of chips.

Because functional modules of the apparatus for adjusting the chip mounting position in the example embodiment of the disclosure correspond to the steps of the foregoing example embodiment of the method for adjusting the chip mounting position, the details not disclosed in the apparatus embodiment of the disclosure can refer to the foregoing embodiment of the method for adjusting the chip mounting position in the disclosure.

In the apparatus for adjusting the chip mounting position provided in this embodiment of the disclosure, the chip mounting position is adjusted according to the average offset for actual mounting positions of the individual chips in the first group of chips, thereby improving mounting precision of the chip mounting position.

A reference is made to FIG. 9 below, which shows a schematic structural diagram of a computer system 900 for implementing an electronic device according to an embodiment of the disclosure. The computer system 900 of the electronic device shown in FIG. 9 is merely an example and should not bring any limitation to the function and use scope of the embodiments of the disclosure.

Figure 9:
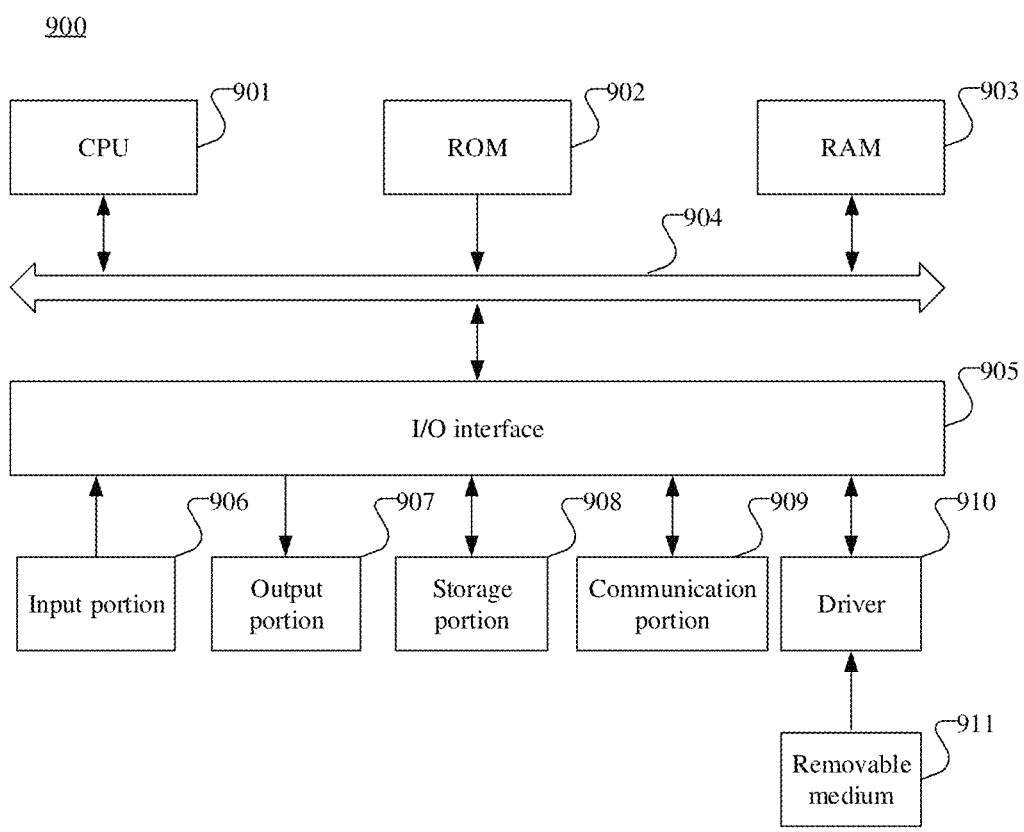
FIG. 9 shows a schematic structural diagram of a computer system for implementing an electronic device according to an embodiment of the disclosure.

As shown in FIG. 9, the computer system 900 includes a Central Processing Unit (CPU) 901, and the CPU may perform various appropriate actions and processing according to a program stored in a Read-Only Memory (ROM) 902 or a program loaded from a storage portion 908 into a Random Access Memory (RAM) 903. The RAM 903 further stores various programs and data required for a system operation. The CPU 901, the ROM 902, and the RAM 903 are connected to each other by a bus 904. An Input/Output (I/O) interface 905 is also connected to the bus 904.

The following parts are connected to the I/O interface 905: an input portion 906 including a keyboard, a mouse, and the like; an output portion 907 including a Cathode Ray Tube (CRT), a Liquid Crystal Display (LCD), a speaker, and the like; a storage portion 908 including a hard disk and the like; and a communication portion 909 including a network interface card such as a LAN card or a modem. The communication portion 909 performs communication processing via a network such as the Internet. A driver 910 is also connected to the I/O interface 905 as required. A removable medium 911, such as a magnetic disk, an optical disc, a magneto-optical disc, a semiconductor memory, or the like, is mounted on the driver 910 as required, so that a computer program read therefrom is mounted into the storage portion 908 as required.

In particular, according to the embodiments of the disclosure, the processes described above with reference to the flowchart may be implemented as a computer software program. For example, an embodiment of the disclosure includes a computer program product that includes a computer program carried on a computer-readable storage medium, and the computer program includes program code used to execute the method shown in the flowchart. In such an embodiment, the computer program may be installed and downloaded from a network by using the communication portion 909, and/or installed from the removable medium 911. When the computer program is executed by the Central Processing Unit (CPU) 901, the foregoing functions defined in the system of the disclosure are executed.

It should be noted that the computer-readable storage medium shown in the disclosure may be a computer-readable signal medium, a computer-readable storage medium, or any combination of the foregoing two. The computer-readable storage medium may be, for example, but is not limited to, an electrical, magnetic, optical, electromagnetic, infrared, or semiconductor system, apparatus, or device, or any combination thereof. A more specific example of the computer-readable storage medium may include but is not limited to: an electrical connection having one or more wires, a portable computer disk, a hard disk, a Random Access Memory (RAM), a Read-Only Memory (ROM), an Erasable Programmable Read-Only Memory (EPROM or flash memory), an optical fiber, a portable Compact Disk Read-Only Memory (CD-ROM), an optical storage device, a magnetic storage device, or any suitable combination thereof. In the disclosure, the computer-readable storage medium may be any tangible medium that includes or stores a program, and the program may be used by or in combination with an instruction execution system, apparatus, or device. In the disclosure, the computer-readable signal medium may include a data signal propagated in a baseband or as a part of a carrier wave, and carries computer-readable program code. The propagated data signal may take a plurality of forms, including but not limited to an electromagnetic signal, an optical signal, or any suitable combination thereof. The computer-readable signal medium may also be any computer-readable storage medium other than the computer-readable storage medium, and the computer-readable storage medium may send, propagate, or transmit a program that is used by or in combination with an instruction execution system, apparatus, or device. The program code included in the computer-readable storage medium may be transmitted by any suitable medium, including but not limited to, a wireless medium, an electric wire, an optical cable, RF, or any suitable combination thereof.

The flowcharts and block diagrams in the accompanying drawings show possible architectures, functions, and operations of systems, methods, and computer program products according to the embodiments of the disclosure. In this regard, each block in the flowchart or the block diagram may represent one module, one program segment, or a part of code, and the module, the program segment, or the part of code includes one or more executable instructions for implementing a specified logical function. It is to be noted that in some alternative implementations, functions marked in the block may also occur in a different order from the order marked in the accompanying drawings. For example, two blocks represented in succession may actually be executed in substantially parallel, and they may sometimes be executed in a reverse order, depending on the function involved. It is to be noted that each block in the block diagram or the flowchart and a combination of blocks in the block diagram or the flowchart may be implemented by using a dedicated hardware-based system that performs a specified function or operation, or may be implemented by using a combination of dedicated hardware and a computer instruction.

The units described in the embodiments of the disclosure may be implemented by using software, or may be implemented by using hardware and the described units may also be disposed in a processor. In some cases, names of these units do not constitute a limitation to the units.

In another aspect, the disclosure further provides a computer-readable storage medium, where the computer-readable storage medium may be included in the electronic device described in the foregoing embodiment, or may exist separately and is not assembled into the electronic device. The computer-readable storage medium carries one or more programs. When the one or more programs are executed by the electronic device, the electronic device implements the method for adjusting the chip mounting position described in the foregoing embodiment.

For example, the electronic device may implement the steps shown in FIG. 1.

It is to be noted that although several modules or units of the device for performing the actions are mentioned in the foregoing detailed descriptions, such division is not mandatory. In fact, according to the implementations of the disclosure, features and functions of two or more modules or units described above may be embodied in one module or unit. On the contrary, features and functions of one module or unit described above may be further divided, so as to be embodied by a plurality of modules or units.

A person skilled in the art may readily understand that the example implementations described herein may be implemented by using software, or also may be implemented by using software in combination with necessary hardware, according to the foregoing descriptions of the implementations. Therefore, the technical solutions in the implementations of the disclosure may be embodied in a form of a software product. The software product may be stored in a non-volatile storage medium (which may be a CD-ROM, a USB flash drive, or a removable hard disk) or a network and includes several instructions for controlling a computer device (which may be a personal computer, a server, a touch terminal, or a network device) to perform the method in the implementations of the disclosure.

A person skilled in the art can easily conceive another implementation solution of the disclosure after considering the specification and practicing the disclosure that is disclosed herein. The application is intended to cover any variations, usages, or adaptive changes of the disclosure. These variations, usages, or adaptive changes comply with general principles of the disclosure, and include common knowledge or a commonly used technical means in the technical field that is not disclosed in the disclosure. The specification and the embodiments are merely considered as examples, and the actual scope and spirit of the disclosure are specified in the following claims.

It should be understood that the disclosure is not limited to the accurate structures that are described in the foregoing and that are shown in the accompanying drawings, and modifications and changes may be made without departing from the scope of the disclosure. The scope of the disclosure is limited only by the appended claims.

The invention claimed is:

1. A method for adjusting a chip mounting position, comprising:
    obtaining offsets of actual mounting positions of individual chips in a first group of chips;
    obtaining an average offset for the actual mounting positions of the individual chips in the first group of chips according to the offsets of the actual mounting positions of the individual chips in the first group of chips;
    adjusting the chip mounting position according to the average offset for the actual mounting positions of the individual chips in the first group of chips; and
    wherein said adjusting the chip mounting position according to the average offset for the actual mounting positions of the individual chips in the first group of chips comprises:
        adjusting, according to a first proportion of the average offset for the actual mounting positions of the individual chips in the first group of chips, a mounting component for mounting the chip.

2. The method according to claim 1, wherein said obtaining offsets of actual mounting positions of individual chips in a first group of chips comprises:
    obtaining initial calibration positions of the individual chips in the first group of chips;
    obtaining the actual mounting positions of the individual chips in the first group of chips; and
    obtaining the offsets of the actual mounting positions of the individual chips in the first group of chips according to the initial calibration positions of the individual chips in the first group of chips and the actual mounting positions of the individual chips in the first group of chips.

3. The method according to claim 1, wherein said adjusting, according to a first proportion of the average offset for the actual mounting positions of the individual chips in the first group of chips, a mounting component for mounting the chip comprises:
    adjusting, according to a half of the average offset for the actual mounting positions of the individual chips in the first group of chips, the mounting component for mounting the chip.

4. The method according to claim 1, wherein said adjusting, according to a first proportion of the average offset for the actual mounting positions of the individual chips in the first group of chips, a mounting component for mounting the chip comprises:
    adjusting, according to the first proportion of the average offset for the actual mounting positions of the individual chips in the first group of chips, a suction nozzle or a mechanical arm for mounting the chip.

5. The method according to claim 1, wherein the offsets of the actual mounting positions of the individual chips in the first group of chips comprise displacement offsets and angle offsets, and said adjusting the chip mounting position according to the average offset for the actual mounting positions of the individual chips in the first group of chips comprises:
    adjusting the chip mounting position according to an average displacement offset and an average angle offset for the actual mounting positions of the individual chips in the first group of chips.

6. The method according to claim 5, wherein said adjusting the chip mounting position according to an average displacement offset and an average angle offset for the actual mounting positions of the individual chips in the first group of chips comprises:
    adjusting, according to a first proportion of each of the average displacement offset and the average angle offset for the actual mounting positions of the individual chips in the first group of chips, a mounting component for mounting the chip.

7. The method according to claim 6, wherein said adjusting, according to a first proportion of each of the average displacement offset and the average angle offset for the actual mounting positions of the individual chips in the first group of chips, a mounting component for mounting the chip comprises:
    respectively obtaining a corresponding adjustment amount of a displacement adjustment motor for the mounting component and a corresponding adjustment amount of an angle adjustment motor for the mounting component according to the average displacement offset and the average angle offset for the actual mounting positions of the individual chips in the first group of chips; and
    adjusting the mounting component according to the corresponding adjustment amount of the displacement adjustment motor for the mounting component and the corresponding adjustment amount of the angle adjustment motor for the mounting component.

8. The method according to claim 7, wherein said adjusting the mounting component according to the corresponding adjustment amount of the displacement adjustment motor for the mounting component and the corresponding adjustment amount of the angle adjustment motor for the mounting component comprises:
    respectively obtaining a pulse number of the displacement adjustment motor for the mounting component and a pulse number of the angle adjustment motor for the mounting component according to the corresponding adjustment amount of the displacement adjustment motor for the mounting component and the corresponding adjustment amount of the angle adjustment motor for the mounting component; and
    adjusting the mounting component according to the pulse number of the displacement adjustment motor for the mounting component and the pulse number of the angle adjustment motor for the mounting component.

9. The method according to claim 5, wherein the displacement offset comprises a displacement offset in a first direction and a displacement offset in a second direction, and said adjusting the chip mounting position according to an average displacement offset and an average angle offset for the actual mounting positions of the individual chips in the first group of chips comprises:
    adjusting the chip mounting position according to an average displacement offset in the first direction, an average displacement offset in the second direction, and the average angle offset for the actual mounting positions of the individual chips in the first group of chips.

10. The method according to claim 1, further comprising:
    giving an alarm when an offset of a chip in the first group of chips exceeds a control limit.

* * * * *